United States Patent [19]

Nakaishi et al.

[11] Patent Number: 4,820,546
[45] Date of Patent: Apr. 11, 1989

[54] METHOD FOR PRODUCTION OF X-RAY-TRANSPARENT MEMBRANE

[75] Inventors: Masafumi Nakaishi, Inagi; Masao Yamada, Yokohama, both of Japan

[73] Assignee: Fujitsu Limited, Kawasaki, Japan

[21] Appl. No.: 98,402

[22] Filed: Sep. 18, 1987

[30] Foreign Application Priority Data

Sep. 19, 1986 [JP] Japan .................. 61-219217
Sep. 19, 1986 [JP] Japan .................. 61-219781

[51] Int. Cl.$^4$ .............................................. B05D 3/06
[52] U.S. Cl. ...................................................... 427/38
[58] Field of Search ........................................... 427/38

Primary Examiner—Bernard Pianalto
Attorney, Agent, or Firm—Staas & Halsey

[57] ABSTRACT

A membrane of the present invention used for a mask for X-ray exposure is made of an amorphous of boron nitride carbide hydrogenated, containing 1 to 10 atomic percent of carbon. This membrane is made in a plasma CVD, whose source gases are ammonia, diborane and methane diluted in argon gas. The flow rate ratio of the ammonia to the diborane is 0.6 to 1.55, the deposition temperature is 350° to 500° C., the gas pressure is 60 to 250 Pa, the applied RF power is 0.1 to 0.17 W/cm$^2$. Thus formed membrane is adequately transparent to a visible light and the X-ray used for mask alignment, while keeping the stiffness enough and the residual stress properly tensile.

17 Claims, 7 Drawing Sheets

| | MATERIAL | LPCVD a-BN:H | PECVD a-BNC:H |
|---|---|---|---|
| PREPARATION CONDITIONS | $NH_3/B_2H_6$ | 0.8 | 1.3 |
| | $CH_4$ (sccm) | — | 10 |
| | TOTAL FLOW RATE (sccm) | 200 | 300 |
| | TEMPERATURE (°C) | 400 | 450 |
| | RF POWER DENSITY ($W/cm^2$) FREQUENCY (MHz) | — — | 0.13 (13.56) |
| CHARACTERISTICS | DEPOSITION RATE (Å/min) | 210 | 800 |
| | TENSILE STRESS ($dyn/cm^2$) | $6.7 \times 10^8$ | $8.6 \times 10^8$ |
| | YOUNG'S MODULUS ($dyn/cm^2$) | $2.6 \times 10^{12}$ | $2.7 \times 10^{12}$ |
| | OPTICAL GAP (eV) | 2.1 | 3.0 |
| | REFRACTIVE INDEX | 2.3 | 2.1 |
| | X-RAY TRANSPARENCY (%) | 90 | 91 |

FIG. 11

| PREPARATION CONDITIONS | | | EVALUATED CONTENTS | | |
|---|---|---|---|---|---|
| DEPOSITION TEMP. (°C) | NH$_3$/B$_2$H$_6$ | FLOW OF CH$_4$ (sccm) | BORON (at.%) | NITROGEN (at.%) | CARBON (at.%) |
| 400 | 0.5 | 10 | 76.6 | 18.6 | 4.8 |
| | 1.0 | 10 | 62.3 | 29.1 | 6.6 |
| | 1.3 | 10 | 57.0 | 35.5 | 7.5 |
| | 1.5 | 10 | 54.0 | 38.9 | 7.1 |
| | 2.0 | 10 | 51.1 | 42.8 | 6.0 |
| | 1.3 | 20 | 59.7 | 30.9 | 9.4 |
| | 1.3 | 30 | 59.7 | 29.5 | 10.9 |
| 350 | 0.5 | 10 | 75.0 | 19.4 | 5.6 |
| 450 | 1.5 | 10 | 56.0 | 36.9 | 7.1 |

OTHER PARAMETERS ARE AS FOLLOW: TOTAL 300 sccm, 200 Pa, 0.13 W/cm$^2$ (13.56 MHz) DILUTED WITH Ar.

METHOD FOR PRODUCTION OF X-RAY-TRANSPARENT MEMBRANE

BACKGROUND OF THE INVENTION

1. Field of the Invention

This invention relates to a material of a membrane for an X-ray mask used in a fabrication process of a fine pattern of a semiconductor device, such as a VLSI (very large scale integrated circuit). The word "membrane" is used to mean a film spreading in a space.

2. Description of the Related Art

Figure 1:
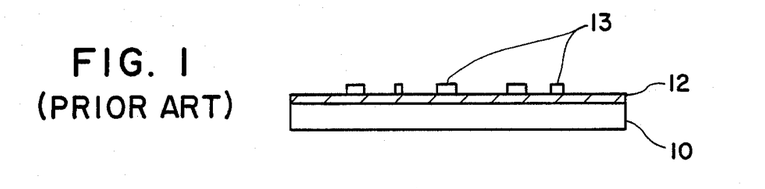
FIG. 1 is a cross-sectional view of a known Xray mask at one stage of fabrication.
Figure 2:
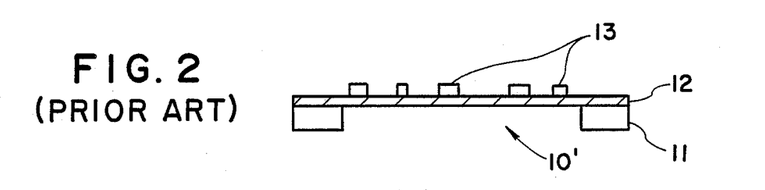
FIG. 2 is a cross-sectional view of the FIG. 1 X-ray mask at another stage of fabrication.

As is well known, an X-ray proximity exposure has been employed in a precise transcription to obtain a finer pattern, such as of sub-micron resolution. Accordingly, a mask for X-ray exposure has also been developed in place of an optical mask using quartz substrate. A structure and the fabrication process of the mask for the X-ray exposure is shown in FIGS. 1 and 2. On a wafer 10, which is usually made of silicon 110 mm in diameter and 4~5 μm thick, there is formed a layer 12 made of a material transparent to the X-ray. Next, a mask pattern 13 made of a metal which is not transparent to the X-ray is formed on the transparent layer 12. Material for the formed mask pattern 13 is chosen from heavy metals, such as gold, tantalum and tungsten, which prevent X-rays from penetrating therethrough; therefore, the mask pattern 13 acts as a mask. Next, the central portion 10' of the wafer 10 is removed typically by a reactive ion etching as shown in FIG. 2. Thus, the central portion of the layer 12 remains as a membrane, and the peripheral portion of the wafer 10 remains as a frame 11 to support the membrane. Thus, the X-ray mask is formed.

Quartz, which has been used for the substrate of an optical mask, cannot be used as an X-ray mask, since quartz absorbs X-rays. If beryllium or boron, both of which are transparent to X-rays, is used for the membrane, an optical alignment of the mask cannot be carried out because these materials are not optically transparent. Therefore, materials suitable for the membrane of the X-ray mask have been intensively investigated, as follows:

1. A polymer of BN (boron nitride), such as reported by Morita et al. in The 33rd Joint Convention of Institutions of the Applied Physics, Spring, 1961, Japan.

2. An amorphous BN:H (hydrogenated boron nitride) or BNC:H (hydrogenated boron nitride carbide), where the notation ":H" indicates that the H (hydrogen atom) is made from a hydride source gas in a CVD (Chemical Vapor Deposition) processing and terminates a dangling bond. This material is reported, for example, ibid or by K. Montesser et al. in "Thin Solid Films" 117(1984) 311–317.

However, there have been discussed only the transparency characteristics to X-rays or visible light. On the other hand, the X-ray membrane must be transparent and, at the same time, have the following mechanical characteristics (which have not heretofore been fully satisfied):

a. Stiffness (represented by Young's modulus and high elastic limit (represented by tensile strength and rigidity).

b. Proper residual tension at the operating condition.

Figure 3:
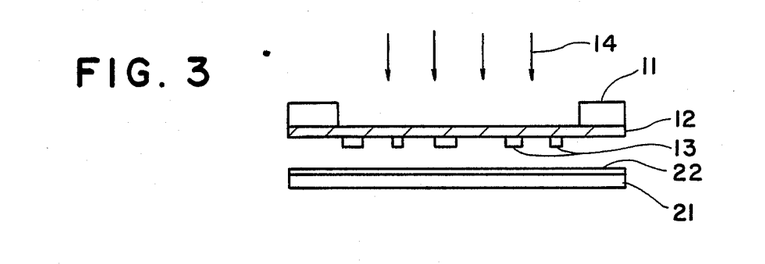
FIG. 3 shows a position of the X-ray mask of FIG. 2 while used for X-ray exposure onto a resist film on a semiconductor wafer.

The above-mentioned stiffness and residual tension are required by the following reason. As shown in FIG. 3, when the X-ray mask is in use having X-rays 14 irradiating from the back of the mask (which is upside-down of FIG. 2), the clearance between the membrane 12 having the mask pattern 13 thereon and the resist film 22 on a wafer 21 must be kept as narrow as approximately 10 μm in order to attain a sharp resolution. If an adequate amount of stiffness and tension is not maintained in the membrane, the membrane may droop downwardly towards the resist film 22, causing a non-uniform clearance thereof, and consequently the clearance must be widened to avoid the pattern touching the resist. This results from the fact that the membrane may be as thin as 4 to 5 μm and have a relatively large diameter of tyically about 60 mm. The resulting residual tension is produced by the intrinsic internal stress and larger thermal shrinkage of the membrane material than that of the frame 11. This is because the membrane is formed at a high temperature, such as 400° C. If the residual tension is negative, i.e. compressive, the membrane is likely to have wrinkles. Therefore, a need exists for a material having a large stiffness as well as a large residual tension therein. The preferable amount of the stiffness of the membrane is approximately $3 \times 10^{12}$ dyne/cm$^2$ of Young's modulus. The preferable amount of the residual tension is approximately 0.5 to $1.0 \times 10^9$ dyne/cm$^2$, which must be lower than the tensile strength of the membrane material so that a neutral break of the membrane can be avoided.

The above-mentioned transparency to visible light is required because the X-ray mask is aligned with the wafer by projecting visible light through the membrane onto the resist film 22. Therefore, unless the membrane is adequately transparent, the required resolution necessary for alignment cannot be achieved.

One of the problems with the known amorphous BN:H materials is that it is not adequately transparent to light used for the alignment, while keeping a proper amount of stiffness and residual tension therein. In other words, if the amorphous BN:H is made thick for gaining strength, transparency is degraded. Among the above-described requirements, stiffness is the most serious. Therefore, a need exists for improvements in stiffness.

SUMMARY OF THE INVENTION

It is an object of the invention, therefore to provide a material used for the membrane of an X-ray mask, having an adequate stiffness as well as adequate residual tension therein while having an adequate transparency to X-rays projected thereto and visible light.

According to the present invention, an X-ray transparent membrane is made of a hydrogenated amorphous boron nitride carbide (a-BNC:H) having the carbon contents of 1 to 10 atomic percent. This material is made by a plasma CVD method, in which diborane (B$_2$H$_6$) gas, ammonia (NH$_3$) gas and methane (CH$_4$) gas are used as source gases diluted in an argon gas. The process conditions are as follows: gas pressure = 60 to 250 Pa (Pascal), applied radio frequency power = 0.1 to 0.17 w/cm$^2$, deposition temperature = 350° to 500° C., and ratio of flow rates of ammonia gas to diborane gas = 0.2 to 1.7. Correlation of this ratio of ammonia/diborane to the deposition temperature may also be specified between two formulas:

For T = 350°0 to 450° C.
R = 0.01 T − 2.8 and R = 0.01 T − 3.2, and
For T = 450° to 500° C.
R = 1.7 and R = 1.3, where R indicates the flow rate ratio of ammonia/diborane and T indicates the deposition temperature in degree centigrade.

Thus, satisfactory Young's modulus, residual tension and transparency are achieved.

The above-mentioned features and advantages of the present invention, together with other objects and advantages, which will become apparent, will be more fully described hereinafter, reference being had to the accompanying drawings forming a part hereof, wherein like numerals refer to like parts throughout.

BRIEF DESCRIPTION OF THE DRAWINGS

Table 1 shows characteristics of the material according to the present invention in comparison with the prior art material.

Table 2 shows carbon contents of the materials of the present invention.

DESCRIPTION OF THE PREFERRED EMBODIMENTS

Figure 4:
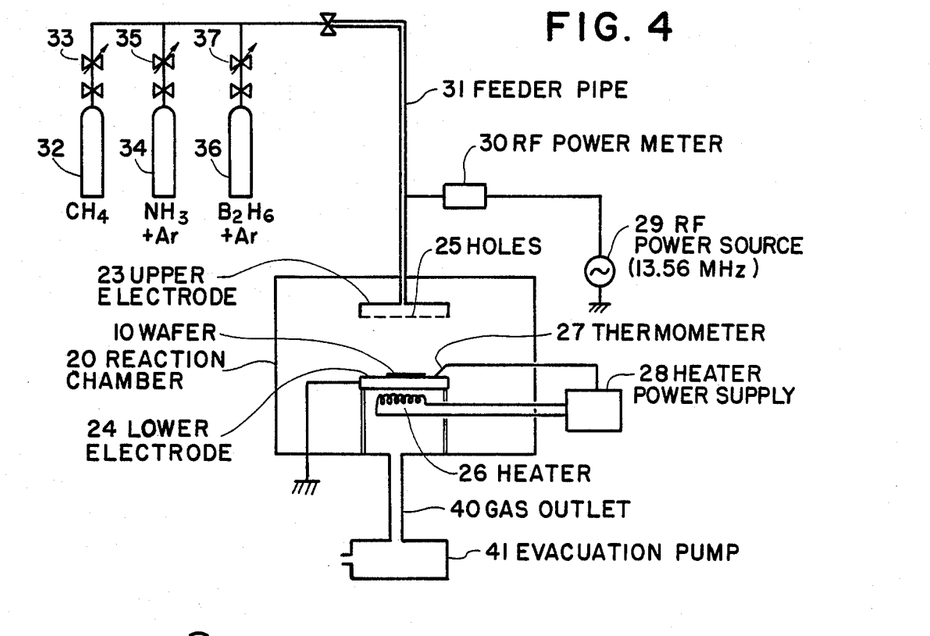
FIG. 4 is a schematic view of a plasma CVD apparatus used for embodying the present invention.

A plasma CVD apparatus used for preliminary experiments as well as for embodying the present invention is first explained refering to FIG. 4. In a reaction chamber 20, there are provided a pair of RF (radio frequency) electrodes 23 and 24, which are made of planar electrodes approximately 20 cm in diameter which are parallel and spaced apart by 35 mm. Into the upper electrode 23 source gases and RF power is fed by a feeder pipe 31. The fed-in gases are supplied further into the reaction chamber 20 through small holes 25 provided on the inside surface of the upper electrode 23, so that fresh gases can be used for the reaction. On the lower electrode 24 a silicon wafer 10 on which a membrane is to be formed is placed. Temperature of the lower electrode 24 is checked by a thermometer 27 provided thereon and the temperature is controlled by a heater 26 powered by power source 28. The lower electrode 24 is electrically grounded. An RF power of 13.56 MHz is supplied from a RF power source 29 via a power meter 30 and the feeder pipe 31 to the upper electrode 23. Another output terminal of the RF power source 29 is grounded. The RF power applied to the two electrodes 23 and 24 generates a plasma therebetween. Source gases for the CVD reaction are a methane gas, an ammonia gas and a diborane gas respectively supplied from a methane gas source 32, an ammonia gas source 34 and a diborane gas source 36, each controlled by valves 33, 35 and 37 through the feeder pipe 31 into the reaction chamber 20. The ammonia and the diborane gases 34 and 36 are diluted in argon gas by 4% by weight respectively. If the diborane content exceeds 6%, the diborane gas becomes polymeric. The argon gas not only acts as a carrier of the source gases but also helps create a stable plasma generation in the reaction chamber. The reaction chamber 20 is evacuated through a gas outlet 40 by a pump 41 so that the inner gas pressure of the reaction chamber is kept at a predetermined value.

Operating conditions to be controlled are as follows:
(1) gas pressure in the reaction chamber;
(2) total flow rate of the supplied source gases;
(3) RF power;
(4) contents ratio of the source gases; and
(5) temperature for forming the deposition.

The gas pressure is determined by the balance of the flow rates of the fed-in gas and the evacuated gas. A high gas pressure means more amount of gas participating the reaction than that of the low pressure, and the gas pressure also gives an immediate effect to the gas discharge, namely the plasma generation. According to experiments by the inventors, the gas does not reliably discharge when the gas pressure is lower than 60 Pa or higher than 250 Pa.

The amount of the gas supply to keep the predetermined gas pressure depends on the size of the CVD apparatus as well as the evacuation pump. Accordingly, in the apparatus by which the experiments were carried out, the predetermined gas pressure 200 Pa is obtained with 300 sccm of the total gas supply including the argon diluent.

Figure 5:
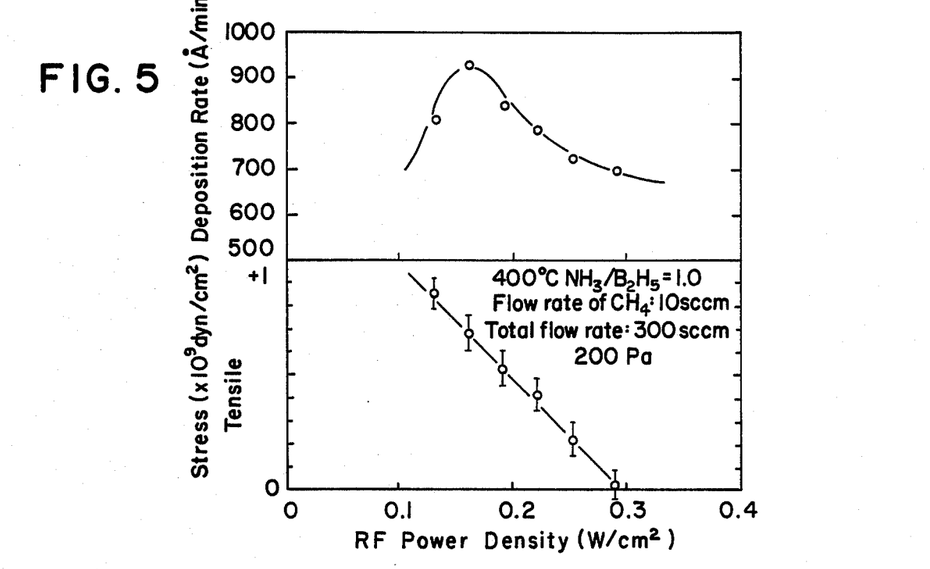
FIG. 5 illustrates the effects of applied RF power density on deposition rate and residual stress at a constant flow rate of $CH_4$.

As for the RF power, in the experiments carried out by the inventors using the apparatus of FIG. 4, the deposition rate and the residual stress are measured with a test piece made at 400° C., with the flow rate ratio $NH_3/B_2H_6=1$. Methane gas flow rate was 10 sccm in total gas flow rate of 300 sccm. As shown in FIG. 5, the proper amount of applied RF power density was found to be 0.10 to 0.17 $W/cm^2$, where the power density is calculated for the applied power per facing area of the RF electrode. Too high power application causes an excess ion bombardment which removes the deposition more than the depositing amount. Too lower power application make it difficult to form the deposition.

Considering the above-described experimental results, the below-referred data are measured by the plasma CVD apparatus shown in FIG. 4 at fixed conditions that the gas pressure is 200 Pa, the applied RF power 0.13 $W/cm^2$, and the 10 sccm flow rate of the methane gas in the total gas flow rate 300 sccm unless otherwise specified.

Figure 6:
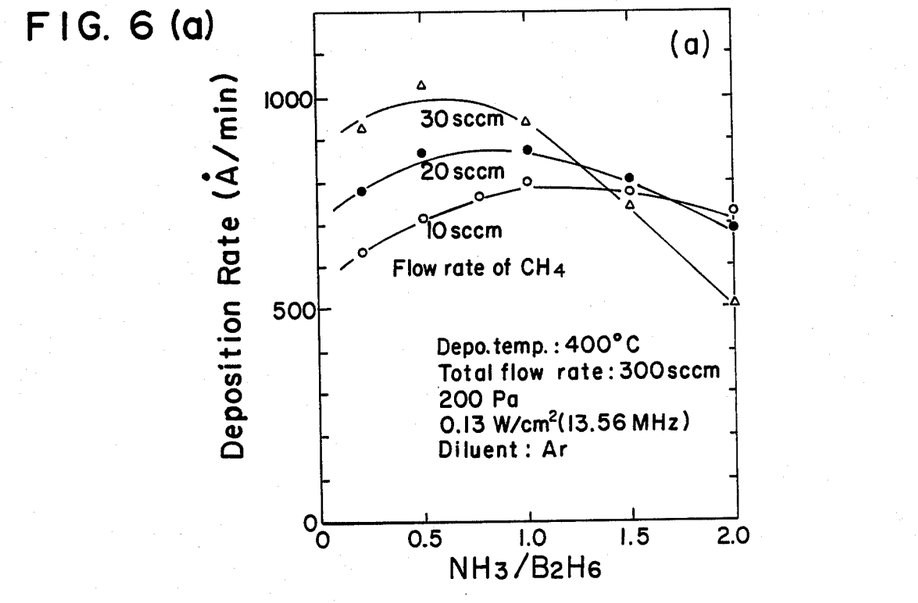
FIGS. 6a and 6b illustrate the effects of the flow rate ratio of $NH_3/B_2H_6$ and the flow rate of $CH_4$ on deposition rate and residual stress at a constant deposition temperature.

Data of deposition rate and residual stress are gathered by varying the flow rate of the methane as well as the flow rate ratio $NH_3/B_2H_6$ while keeping the total gas flow rate constantly at 300 sccm as well as the deposition temperature constantly at 400 ° C., as shown in FIG. 6(a) and (b) respectively. It is observed in the figures that the residual stress is not influenced so much by the amount of the methane flow rate, while the deposition rate is influenced for some degree.

Figure 7:
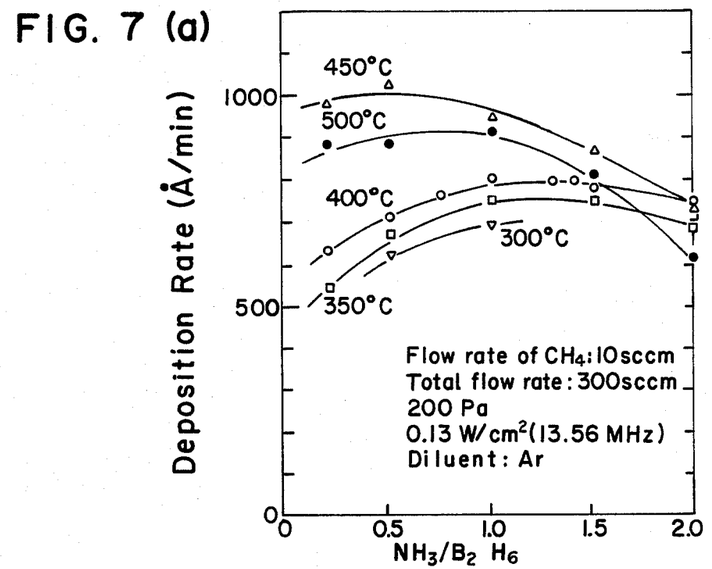
FIGS. 7a and 7b illustrate the effects of the flow rate ratio of $NH_3/B_2H_6$ and deposition temperature on deposition rate and residual stress at a constant flow rate of $CH_4$.
Figure 8:
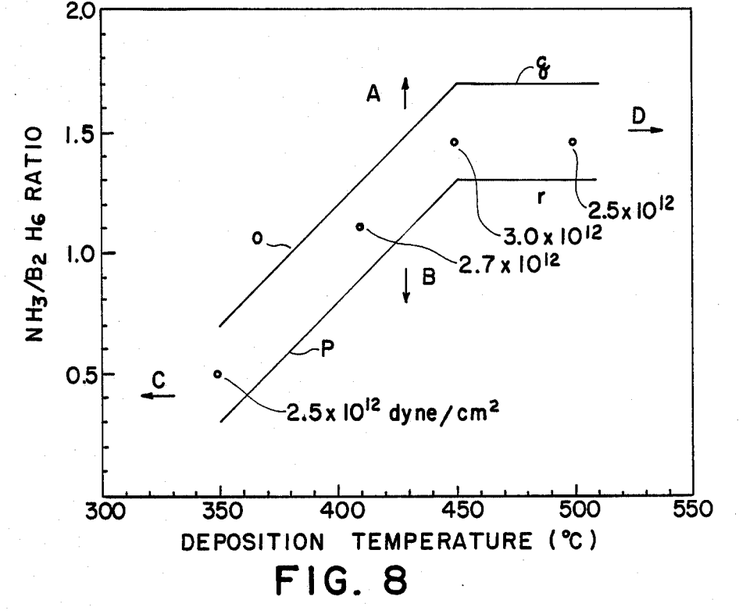
FIG. 8 shows optimum correlation of a flow rate ration of $NH_3/B_2H_6$ and deposition temperature.

Accordingly, fixing the methane gas flow rate constantly at 10 sccm, the deposition rate and the residual stress for varied temperatures as well as varied flow rate ratios $NH_3/B_2H_6$ is measured as shown in FIG. 7(a) and (b) respectively. It is observed in the figures that there is an optimum point of the flow rate ratio of $NH_3/B_2H_6$ for each deposition temperature, and an optimum temperature of the deposition temperature nearly at 450° C. At 500° C. the stress variation becomes of a different mode. Summarizing the obtained data, values of Young's modulus of thus produced membrane are written in FIG. 8 as dependant of the deposition temperature and the flow rate ratio of $NH_3/B_2H_6$. Optimum area of the correlation between the deposition temperature and the flow rate ratio of $NH_3/B_2H_6$ is defined by the area sandwiched by the below-cited formula (o) and (p), and the area sandwiched by the below-cited formula (q) and (r), in which R indicates a flow rate ratio of $NH_3/B_2H_6$, and T indicates the deposition temperature in degree centigrade:

For the temperature range between 350° and 450 ° C., $$R \geq 0.01\ T - 2.8 \ldots 2.8 \ldots \quad (o), \text{ and}$$

$$R = 0.01\ T - 3.2 \ldots (p)$$

For the temperature range between 450° and 500 ° C., $$R \geq 1.7 \ldots \quad (q), \text{ and}$$

$$R = 1.3 \ldots \quad (r).$$

The status of the produced material at the four areas outside the above-mentioned optimum area in the figure, respectively indicated by arrow marks A ~D are as follows: At the area indicated by the arrow mark A, the tensile stress becomes too weak or rather compressive resulting in wrinkles of the produced membrane. At the area indicated by the arrow mark B, the tensile stress becomes so strong that the produced membrane cannot withstand its own tensile strength, thereby resulting in breakage. At the area indicated by the arrow mark C, namely below 350° C., the produced membrane becomes less consolidated and also loses its reproducibility. At the area indicated by the arrow mark D, namely over 500° C., not only the Young's modulus does not increase but also the produced material becomes a different type.

Figure 9:
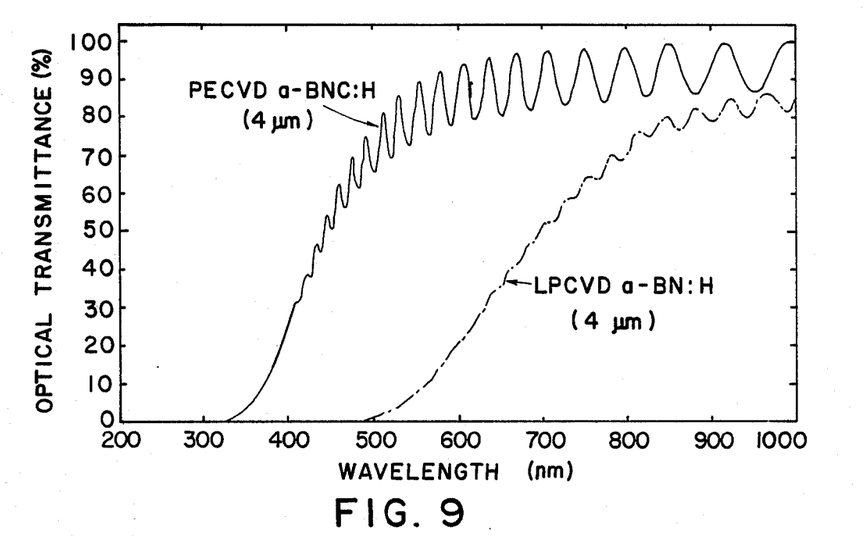
FIG. 9 shows optical transmittance depending on the wave length.
Figure 10:
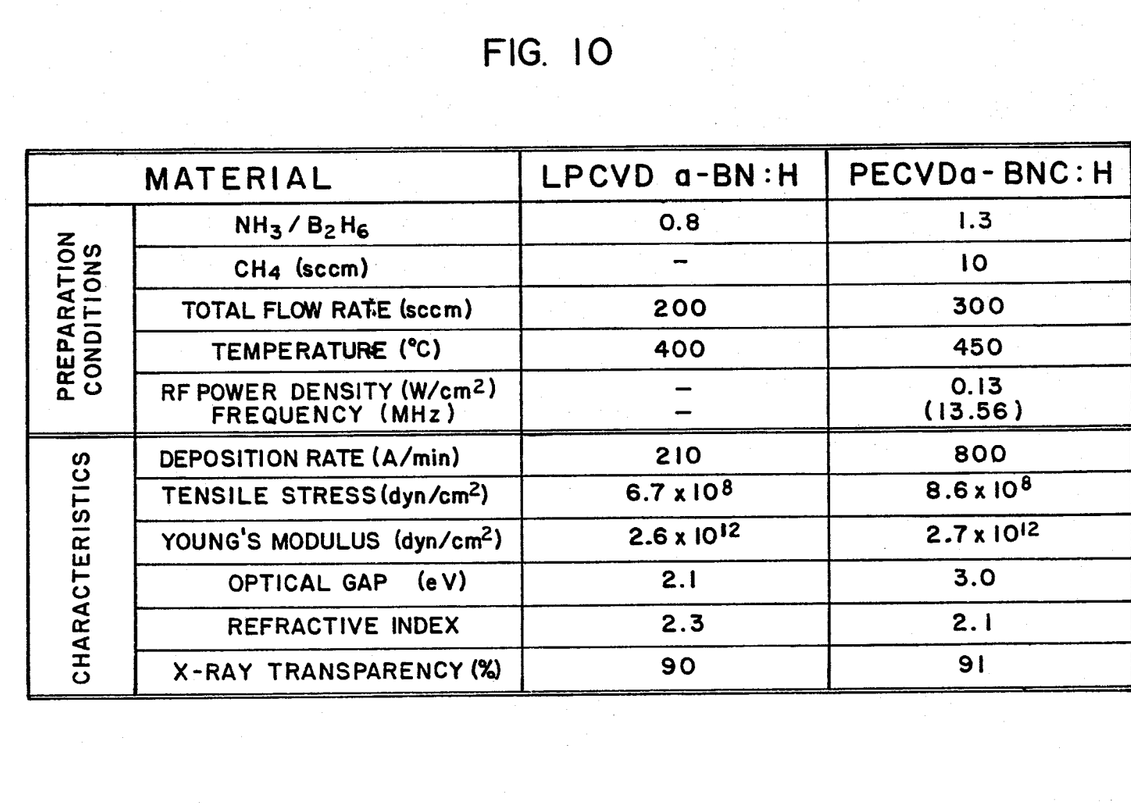

Comparison of the most typical BNC:H of the present invention with the most typical prior art aBN:H (amorphous boron nitride made by low pressure CVD) each 4 $\mu$m thick is shown in table 1, where characteristics of transparency to both visible light and X-rays are included. The optical gap (energy) in the table defines the absorption edge of the amorphous material, and corresponds to the lower end of the absorbing wave length on an analogy to a crystal material. The lower value of the optical gap means the wider range of the wave length and better transparency to the light. Transparency for various wave length is also compared in FIG. 9. As observed in the table 1, tensile stress, Young's modulus and X-ray transparency achieve about the same order of the BN:H, allowing a wider margin. However, transparency to visible light is improved from 2.1 eV to 3.0 eV in the optical gap. Transparency at 633 nm, which is of a He-Ne laser widely used for the mask alignment, is improved from 30% to ~90%. This is the advantage of the invention.

Though in the above-described embodiment of the invention argon is used as a diluent, or a carrier of source gases, nitrogen may be used in place of the argon. It is supposed that the nitrogen gas shares some part of supply of nitrogen atoms from the $NH_3$ gas, resulting in requiring less $NH_3$ flow rate ratio as an optimum condition. Consequently, the amorphous BNC:H made with the flow rate ratio of $NH_3/B_2H_6 = 0.8$ in nitrogen gives the following results: X-ray transparency=95%, optical gap=2.8 eV, residual stress=$3.7 \times 10^8$ dyne/cm$^2$, and Young's modulus=$1.2 \times 10^{12}$ dyne/cm$^2$.

A method for measuring the residual stress and Young's modulus includes measuring the swelling of a circular membrane whose periphery is fixed on a frame by the use of Newtonian Interferometry when a side of the membrane is pressed by air pressure, then calculating the residual stress and Young's modulus with the obtained amount of the swelling, etc. The frame for supporting the membrane to be measured is a silicon wafer of <100>, 525 $\mu$m thick, having $1.3 \times 10^{12}$ dyne/cm$^2$ Young's modulus, and 0.28 Poisson's ratio. Preparation of the test piece is as follows: after an approximately 4 $\mu$m thick amorphus BNC:H is formed on the wafer, 40 mm in diameter of the central portion of the silicon wafer is removed by etching. Thus, a test piece of the membrane is formed.

Atomic contents of the produced amorphous BNC:H by various production conditions are evaluated and shown in Table 2. By referring these data with the residual stress as well as Young's modulus of FIGS. 6 through 7 and Table 1, it is apparent that the carbon contents contributes to provide a material having an improved transparency to visible light and proper values of the mechanical strength.

The above-described amount of the applied RF power density is for the electrodes in the apparatus described in FIG. 4. Therefore, if the dimension of the electrodes, particularly the clearance of the two parallel electrodes, is different from 35 mm of FIG. 4, the optimum value of the applied RF power density may be different. A different RF power frequency from 13.56 MHz may also require a different optimum power supply condition.

The many features and advantages of the specification and thus, it is intended by the invention are apparent from the detailed appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What we claim is:

1. A method for producing a hydrogenated amorphous boron nitride carbide membrane for an X-ray mask by a plasma chemical vapor deposition using a diborane gas and ammonia gas both diluted by an inert gas, and a methane gas, the method comprising:
   depositing a membrane on a substrate;
   maintaining gas pressure during deposition at 60 to 250 Pascal; and
   correlating deposition temperature and a flow rate ratio of said ammonia gas to said diborane gas according to the following ranges, where R indicates flow rate ratio of ammonia to diborane and T indicates deposition temperature in degree centigrade:

R is between R=0.01 T−2.8 and R=0.01 T−3.2; and T is between 350° to 450° C.

2. A method for producing a hydrogenated amorphous boron nitride carbide according to claim 1, wherein the plasma chemical vapor deposition uses two radio frequency electrode plates, and the method further comprising applying a radio frequency power of 0.10 to 0.17 W/cm$^2$ calculated by an area of one of the two radio frequency electrode plates used in the plasma chemical vapor deposition.

3. A method for producing a hydrogenated amorphous boron nitride carbide according to claim 2, further comprising applying a radio frequency power of about 13.56 MHz.

4. A method for producing a hydrogenated amorphous boron nitride carbide according to claim 1, or 2, wherein said inert gas is argon.

5. A method for producing a hydrogenated amorphous boron nitride carbide according to claim 1, or 2, wherein said inert gas is nitrogen.

6. A method for producing a hydrogenated amorphous boron nitride carbide according to claim 1, wherein a methane gas is added to the ammonia and the diborane gas by 33 to 84% in volume of the total of the ammonia and the diborane gas.

7. A method for producing a hydrogenated amorphous boron nitride carbide according to claim 2 or 6, wherein the electrodes to which said radio frequency power is applied are parallel and spaced apart by about 35 mm.

8. A method for producing a hydrogenated amorphous boron nitride carbide membrane for an X-ray mask by a plasma chemical vapor deposition using a diborane gas and ammonia gas both diluted by an inert gas, and a methane gas, the method comprising:
    depositing a membrane on a substrate;
    maintaining gas pressure during deposition at 60 to 250 Pascal; and
    correlating deposition temperature and a flow rate ratio of said ammonia gas to said diborane gas according to the following ranges, where R indicates flow rate ratio of ammonia to diborane and T indicates deposition temperature in degree centigrade:
    R is between 1.7 and 1.3 and T is between 450° to 500° C.

9. A method for producing a hydrogenated amorphous boron nitride carbide according to claim 7, wherein the plasma chemical vapor deposition uses two radio frequency electrode plates, and the method further comprising applying a radio frequency power of 0.10 to 0.17 W/cm$^2$ calculated by an area of one of the two radio frequency electrode plates used in the plasma chemical vapor deposition.

10. A method for producing a hydrogenated amorphous boron nitride carbide according to claim 9, further comprising applying a radio frequency power of about 13.56 MHz.

11. A method for producing a hydrogenated amorphous boron nitride carbide according to claim 9, wherein the electrodes to which said radio frequency power is applied are parallel and spaced apart by about 35 mm.

12. A method for producing a hydrogenated amorphous boron nitride carbide according to claim 9, wherein said inert gas is argon.

13. A method for producing a hydrogenated amorphous boron nitride carbide according to claim 9, wherein said inert gas is nitrogen.

14. A method for producing a hydrogenated amorphous boron nitride carbide according to claim 8, wherein a methane gas is added to the ammonia and the diborane gas by 33 to 84% in volume of the total of the ammonia and the diborane gas.

15. A method for producing a hydrogenated amorphous boron nitride carbide according to claim 14, wherein the electrodes to which said radio frequency power is applied are parallel and spaced apart by about 35 mm.

16. A method for producing a hydrogenated amorphous boron nitride carbide according to claim 8, wherein said inert gas is argon.

17. A method for producing a hydrogenated amorphous boron nitride carbide according to claim 8, wherein said inert gas is nitrogen.

* * * * *

UNITED STATES PATENT AND TRADEMARK OFFICE
CERTIFICATE OF CORRECTION

PATENT NO. : 4,820,546

DATED : April 11, 1989

INVENTOR(S) : Nakaishi et al.

It is certified that error appears in the above-identified patent and that said Letters Patent is hereby corrected as shown below:

COLUMN 1, line 59, "heretofore" should be --heretofor--;
            line 61, "modulus" should be -- modulus) --.

COLUMN 2, line 25, "neutral" should be --natural--.

Figure 11:
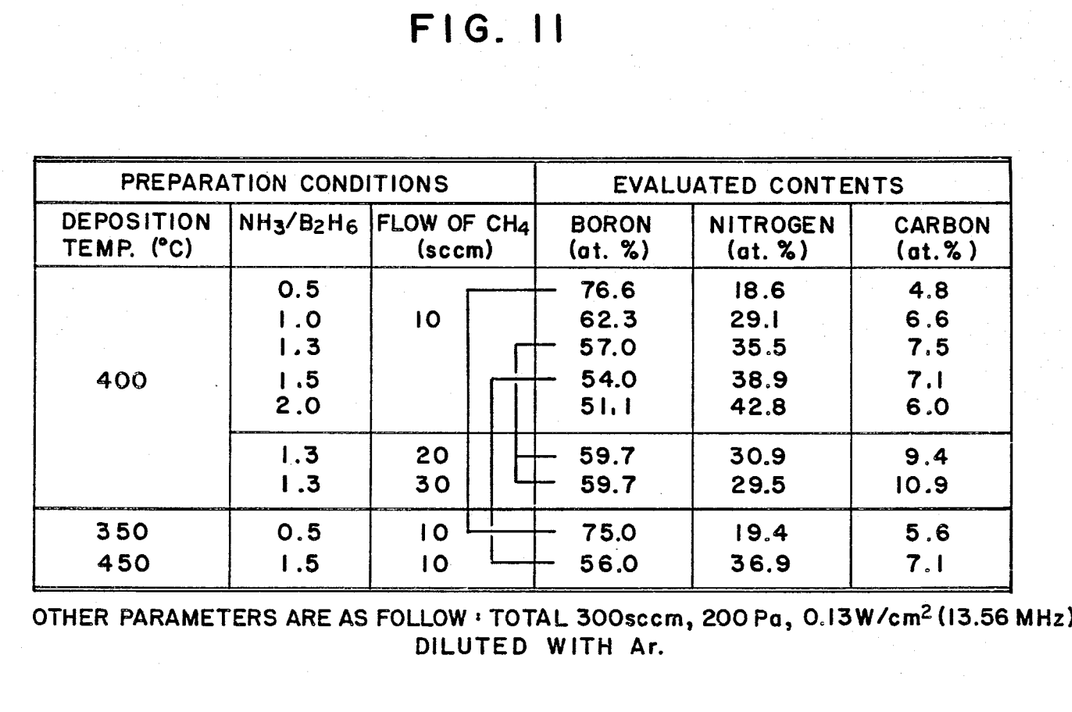

COLUMN 3, line 35, "ration" should be --ratio--;
            line 38, "Table 1" should be --FIG. 10--'
            line 41, "Table 2" should be --FIG. 11--.

COLUMN 4, line 50, "lower" should be --low--.

COLUMN 5, line 23, "R320.01 T-2.8" should be --R = 0.01 T-2.8--;
            line 23, delete "2.8" (second occurrence).

COLUMN 5, line 26, "R321.7" should be --R=1.7--

Signed and Sealed this

Twelfth Day of June, 1990

Attest:

HARRY F. MANBECK, JR.

Attesting Officer

Commissioner of Patents and Trademarks